(12) United States Patent
Miyazaki

(10) Patent No.: US 7,095,275 B2
(45) Date of Patent: Aug. 22, 2006

(54) BTL AMPLIFIER CAPABLE OF PROVIDING STABILITY OF OFFSET COMPENSATION

(75) Inventor: Katsumi Miyazaki, Hyogo (JP)

(73) Assignees: Renesas Technology Corp., Tokyo (JP); Renesas Device Design Corp., Hyogo (JP)

(*) Notice: Subject to any disclaimer, the term of this patent is extended or adjusted under 35 U.S.C. 154(b) by 64 days.

(21) Appl. No.: 10/870,956

(22) Filed: Jun. 21, 2004

(65) Prior Publication Data
US 2004/0263243 A1    Dec. 30, 2004

(30) Foreign Application Priority Data
Jun. 25, 2003 (JP) ............... 2003-180629

(51) Int. Cl.
*H03F 1/02* (2006.01)
(52) U.S. Cl. .................. 330/9; 327/124
(58) Field of Classification Search .............. 330/9, 330/51; 327/124, 307
See application file for complete search history.

(56) References Cited

U.S. PATENT DOCUMENTS 4,752,744 A * 6/1988 Aoki ................... 330/260
5,061,900 A   10/1991 Vinn et al.
6,710,645 B1 * 3/2004 Isken et al. ............ 330/9
6,724,248 B1 * 4/2004 Llewellyn ............. 330/9

FOREIGN PATENT DOCUMENTS

JP    5-335850    12/1993

* cited by examiner

*Primary Examiner*—Khanh Van Nguyen
(74) *Attorney, Agent, or Firm*—McDermott Will & Emery LLP

(57) ABSTRACT

A BTL amplifier has a resistance element connected to an output reference voltage input terminal of an inverting amplifier. For offset compensation of the BTL amplifier, a variable current source controller controls an input switching circuit to cause application of compensation input voltages sent from an internal reference voltage source to a first input terminal and a second input terminal. The variable current source controller also controls a variable current source in response to an output signal from a comparator to minimize an output offset voltage, whereby a current flowing through the resistance element is adjusted to control the voltage at the output reference voltage input terminal.

5 Claims, 4 Drawing Sheets

BTL AMPLIFIER CAPABLE OF PROVIDING STABILITY OF OFFSET COMPENSATION

BACKGROUND OF THE INVENTION

1. Field of the Invention

The present invention relates to a BTL (balanced transformer-less) amplifier and more particularly, to offset voltage compensation of the BTL amplifier.

2. Description of the Background Art

In an amplifier system called BTL (balanced transformerless), two amplifier circuits are actuated in reverse phase with the aim of obtaining the output between their respective output terminals that is double in amplitude the output obtained when these amplifier circuits are used singly. An amplifier using such a system is called as a BTL amplifier, an example of which is introduced in Japanese Patent Application Laid-Open No. 5-335850 (1993) (pages 2–3 and FIGS. 1–3), for example.

An operational amplifier constituting the BTL amplifier generally comprises a transistor pair such as a differential pair circuit or a current mirror circuit, whose operating characteristic has great dependence on match in electrical characteristic between the transistors as a pair. When the input voltage of the operational amplifier is set to zero, the output voltage should also ideally be zero. However, a nonzero output voltage is produced due to mismatch in characteristic between the transistors as a pair that form the operational amplifier, for example, which means generation of an output offset voltage which is the voltage appearing on the output when the input voltage is set to zero.

For cost reduction of ICs, use of MOS devices as semiconductor device structures has been promoted. However, MOS transistors exhibit a wider range of variation in electrical characteristic than bipolar transistors. The operational amplifier using a pair of MOS transistors is thus likely to generate an output offset voltage and an input offset voltage (the voltage to give a zero output voltage). Accordingly, when the operational amplifier as a constituent of the BTL amplifier uses a pair of MOS transistors for cost reduction, the BTL amplifier may generate an offset voltage. Generation of an offset voltage may adversely affect a post-stage circuit of the BTL amplifier, or may generate unintended current flow through a load in a no-signal stage.

Techniques such as zapping in outgoing inspection, use of an offset canceller by means of a capacitor, calibration for offset voltage compensation in a system as a whole comprising MOS devices, and the like, are responsive to suppression of generation of an offset voltage in MOS transistors. Zapping in outgoing inspection increases inspection cost and causes chip size increase, thus inhibiting cost reduction as an advantage of MOS devices. Use of an offset canceller by means of a capacitor encounters a difficulty in maintaining the amount of trimming with stability, and hence, is not suitably applied in MOS devices operating under severe conditions such as high temperature, large current and negative voltage. In order to realize cost reduction while providing stable compensation of an offset voltage, calibration in a system as a whole is effectively applicable.

SUMMARY OF THE INVENTION

It is therefore an object of the present invention to provide a BTL amplifier system allowing stable offset voltage compensation at low cost.

The present invention is intended for a BTL amplifier system with a BTL amplifier including a differential amplifier for amplifying a voltage difference between first and second input terminals to output the amplified voltage difference as a first output voltage, and an inverting amplifier for inverting the first output voltage to output the inverted first output voltage as a second output voltage. According to the present invention, the BTL amplifier system includes a compensation input voltage application circuit, a comparator, and a reference voltage control circuit. The compensation input voltage application circuit is capable of applying compensation input voltages at the same level to the first and second input terminals. The comparator makes comparison between first and second compensation output voltages to output a signal indicating the result of comparison. The first and second compensation output voltages are respectively the first and second output voltages as a result of application of the compensation input voltages to the first and second input terminals. The reference voltage control circuit performs offset compensation by controlling an output reference voltage of the inverting amplifier in response to the signal from the comparator to minimize a difference between the first and second compensation output voltages.

According to the present invention, the output voltage between first and second output terminals includes no offset voltage. As a result, an offset voltage does not cause undesirables such as adverse effect on a post-stage circuit of the BTL amplifier, or generation of unintended current flow through a load in a no-signal stage. The present invention is effective especially for a high gain BTL amplifier.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
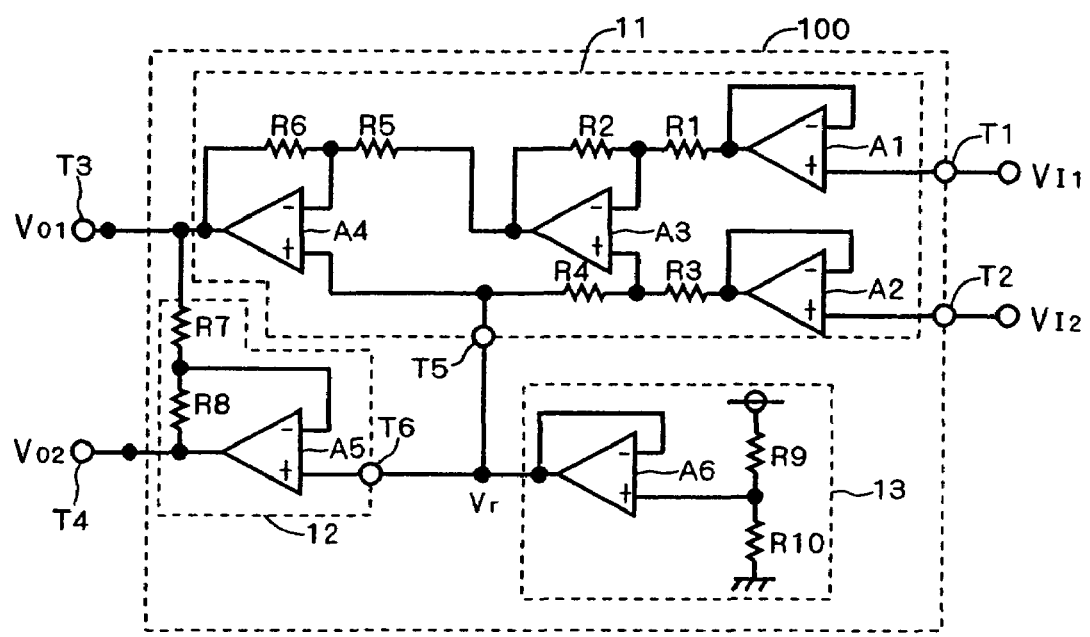
FIG. 4 is a circuit diagram of a conventional master-slave BTL amplifier.

Prior to description of the present invention, a master-slave BTL amplifier will be discussed in detail. FIG. 4 is a circuit diagram of a conventional master-slave BTL amplifier. A BTL amplifier 100 comprises a differential amplifier 11 at the master side, an inverting amplifier 12 at the slave side, and an output reference voltage generation circuit 13. The differential amplifier 11 and the inverting amplifier 12 respectively have output reference voltage input terminals T5 and T6 receiving an output reference voltage $V_r$ generated by the output reference voltage generation circuit 13.

The differential amplifier 11 amplifies the difference between first and second external input voltages $V_{I1}$ and $V_{I2}$ respectively applied to first and second input terminals T1 and T2. The voltage difference thereby amplified is sent to a first output terminal T3 as a first output voltage $V_{O1}$ with respect to the output reference voltage $V_r$. The inverting amplifier 12 inverts the first output voltage $V_{O1}$ with respect to the output reference voltage $V_r$, and sends the resultant voltage to a second output terminal T4 as a second output voltage $V_{O2}$. As a result, the output between the first and second output terminals T3 and T4 is double in amplitude the output obtained when the differential amplifier 11 is used singly.

With reference to FIG. 4, the differential amplifier 11 has a voltage follower including operational amplifiers A1 and A2, a differential amplifier circuit including an operational amplifier A3 and resistance elements R1 through R4, and an inverting amplifier circuit including an operational amplifier A4 and resistance elements R5 and R6. The inverting amplifier 12 has an operational amplifier A5 and resistance elements R7 and R8. The output reference voltage generation circuit 13 has resistance elements R9 and R10 for division of a voltage by the predetermined ratio (such as ½) between a power supply and a ground, and a voltage follower including an operational amplifier A6.

An output offset voltage $\Delta V_O$ is given by resistances $R_7$ and $R_8$ of the resistance elements R7 and R8, respectively, and the output reference voltage $V_r$, as seen from the following formula (1):

$$\Delta V_O = (1 + R_8/R_7) \cdot (V_{OF1} - V_r + \epsilon) \quad (1)$$

where $V_{OF1}$ is the first output voltage $V_{O1}$ caused by a zero input voltage ($V_{I1} = V_{I2}$), and $\epsilon$ is the input offset voltage of the operational amplifier A5. That is, an output offset voltage is generated when $V_{OF1} - V_r + \epsilon = 0$ is not satisfied. The ideal BTL amplifier 100 satisfies both $V_{OF1} = V_r$ and $\epsilon = 0$ to realize $\Delta V_O = 0$, thus generating no offset voltage.

First Preferred Embodiment

Figure 1:
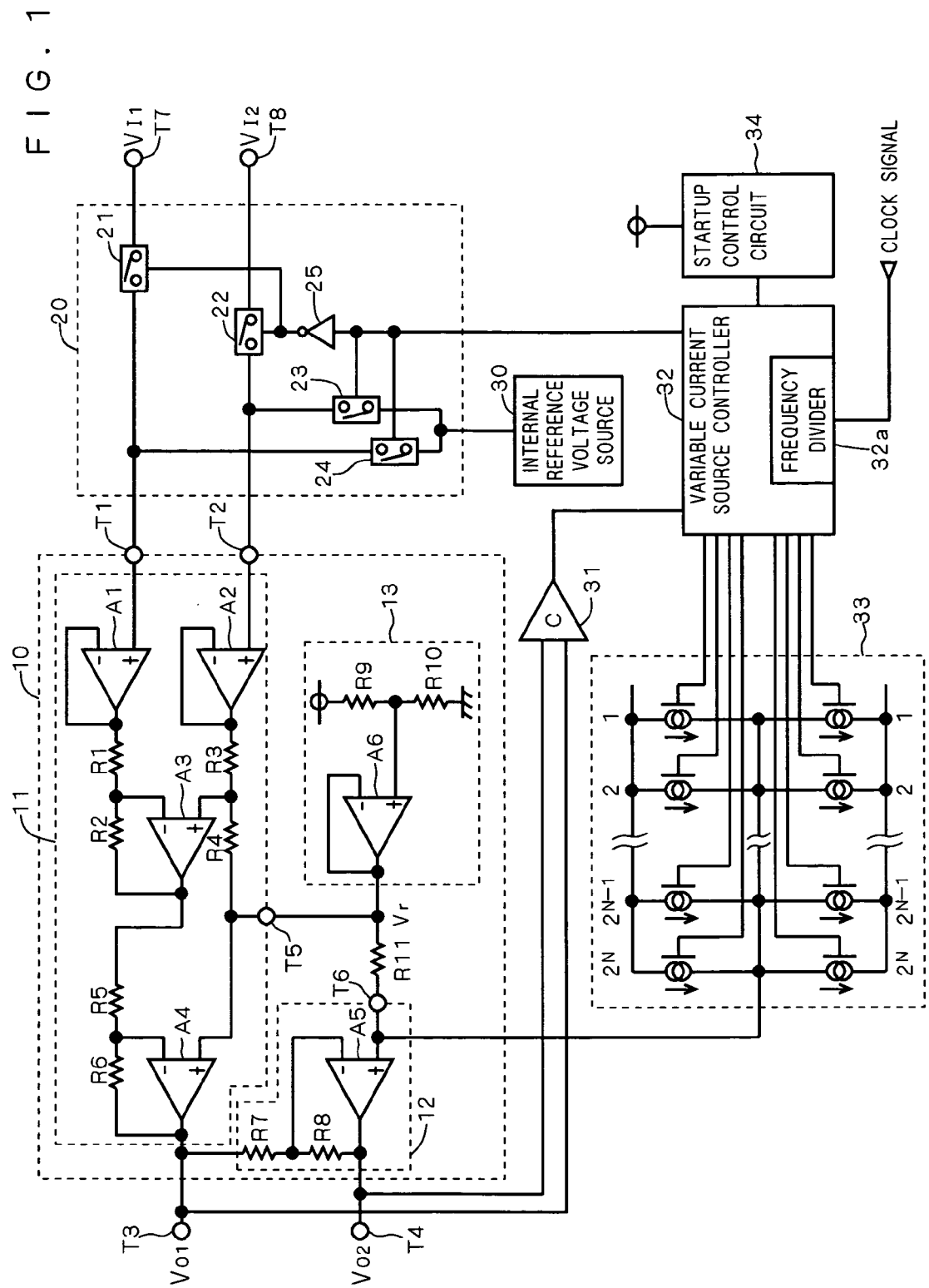
FIG. 1 shows the configuration of a BTL amplifier system according to the present invention.

FIG. 1 shows the configuration of a BTL amplifier system according to the present invention that comprises a master-slave BTL amplifier 10, an input switching circuit 20, an internal reference voltage source 30, a comparator 31, a variable current source controller 32, a variable current source 33, and a startup control circuit 34. The BTL amplifier 10 of FIG. 1 comprises the components corresponding to those of the BTL amplifier 100 of FIG. 4, which are identified with the same reference numerals.

Except for a resistance element R11 interposed between the output reference voltage input terminal T6 of the inverting amplifier 12 and the output reference voltage generation circuit 13, the BTL amplifier 10 has the same configuration as the one of the BTL amplifier 100 shown in FIG. 4. The differential amplifier 11 at the master side, the inverting amplifier 12 at the slave side, and the output reference voltage generation circuit 13 have the circuit configurations as discussed, and hence, the detailed description thereof is omitted. The BTL amplifier system of FIG. 1 serves for offset voltage compensation (hereinafter referred to as "offset compensation") of the BTL amplifier 10.

The input switching circuit 20 comprises switching circuits 21 through 24 and an inverter 25, and is controlled by the variable current source controller 32. The first input terminal T1 is connected through the switching circuit 21 to a first external input terminal T7 receiving the first external input voltage $V_{I1}$. The second input terminal T2 is connected through the switching circuit 22 to a second external input terminal T8 receiving the second external input voltage $V_{I2}$. The first and second input terminals T1 and T2 are both connected to the internal reference voltage source 30 through the switching circuits 24 and 23, respectively.

A control signal sent to the switching circuits 23 and 24 is subjected to inversion at the inverter 25, and a resultant signal is sent to the switching circuits 21 and 22. Accordingly, on state of the switching circuits 21 and 22 means off state of the switching circuits 23 and 24, whereas off state of the switching circuits 21 and 22 means on state of the switching circuits 23 and 24. That is, the input switching circuit 20 switches voltage application between the first and second external input voltages $V_{I1}$ and $V_{I2}$ to the first and second input terminals T1 and T2, respectively, and compensation input voltages generated by the internal reference voltage source 30 to the first and second input terminals T1 and T2. Accordingly, the input switching circuit 20 and the internal reference voltage source 30 together serve as a circuit for compensation input voltage application capable of applying compensation input voltages at the same level to the first and second input terminals T1 and T2. For the offset compensation of the BTL amplifier 10, the variable current source controller 32 controls the input switching circuit 20 to cause application of the compensation input voltages sent from the internal reference voltage source 30 to the first and second input terminals T1 and T2. The compensation input voltage may have an arbitrary level as long as it is a stable direct voltage but preferably, its level is suitably determined according to the system voltage of a device into which the BTL amplifier 10 is incorporated.

While the first and second input terminals T1 and T2 receive the compensation input voltages (that is, in the offset compensation period), the comparator 31 compares the voltage at the first output terminal T3 (first output voltage $V_{O1}$) and the voltage at the second output terminal T4 (second output voltage $V_{O2}$), and outputs a signal indicating the result of comparison to the variable current source controller 32. In the present specification, the first and second output voltages $V_{O1}$ and $V_{O2}$ as a result of application of the compensation input voltages to the first and second input terminals T1 and T2 will be referred to as "a first compensation output voltage" and "a second compensation output voltage", respectively. In the first preferred embodiment, the signal indicating the result of comparison sent from the comparator 31 is placed at L (low) level in the event that the second compensation output voltage is higher than the first compensation output voltage, whereas it is placed at H (high) level in the event that the first compensation output voltage is higher than the second compensation output voltage.

In the BTL amplifier system shown in FIG. 1, the startup control circuit 34 controls timing of the offset compensation. In the first preferred embodiment, the startup control circuit 34 monitors a power supply voltage. At the time when turn-on of the BTL amplifier system is detected, the startup control circuit 34 allows offset compensation. When the offset compensation is allowed, the startup control circuit 34 sends a compensation enable signal to the variable current source controller 32.

The variable current source controller 32 receives the signal indicating the result of comparison from the comparator 31, the compensation enable signal from the startup control circuit 34, and a predetermined clock signal that has been divided in frequency by a frequency divider 32a stored in the variable current source controller 32. On receipt of the compensation enable signal, the variable current source controller 32 controls the input switching circuit 20 and the variable current source 33 in response to the signal indicating the result of comparison and the clock signal, whereby offset compensation of the BTL amplifier 10 is executed.

The variable current source 33 comprises two groups each with constant current sources weighted as $2^N$, $2^{N-1}$, ..., 2 and 1, where N represents the resolution of a digital signal (the number of bits) sent from the variable current source controller 32 to control the variable current source 33, which signal will be hereinafter referred to as a "digital control signal". In response to the N-bit digital control signal sent from the variable current source controller 32, the variable current source 33 performs on-off control of the N number of constant current sources. The magnitude and direction of a current flowing through the resistance element R11 is controlled accordingly, whereby the voltage at the output reference voltage input terminal T6 of the inverting amplifier 12 is changed. The output reference voltage of the inverting amplifier 12 depends on the voltage at the output reference voltage input terminal T6 and hence, control of the variable current source 33 by the variable current source controller 32 results in adjustment of the second output voltage $V_{O2}$ (including the second compensation output voltage).

Based on the signal indicating the result of comparison sent from the comparator 31, the variable current source controller 32 controls the variable current source 33 to minimize the difference between the first and second compensation output voltages, to thereby make adjustment of a current flowing through the resistance element R11, which leads to control of the voltage at the output reference voltage input terminal T6. As a result, the offset voltage of the BTL amplifier 10 is compensated. That is, the resistance element R11, the variable current source controller 32, and the variable current source 33 together serve as a reference voltage control circuit.

Next, the theory of the offset compensation according to the first preferred embodiment will be discussed. The output offset voltage $\Delta V_O$ of the BTL amplifier 10 of FIG. 1 is given by the resistances $R_7$ and $R_8$ of the resistance elements R7 and R8, respectively, the output reference voltage $V_r$, and a voltage drop $V_{R11}$ of the resistance element R11, as seen from the following formula (2):

$$\Delta V_O = (1+R_8/R_7) \cdot (V_{OF1} - V_r + V_{R11} + \epsilon) \quad (2)$$

where $V_{OF1}$ is the first output voltage $V_{O1}$ caused by a zero differential input voltage ($V_{I1}=V_{I2}$), and $\epsilon$ is the input offset voltage of the operational amplifier A5. That is, the BTL amplifier 10 generates no offset voltage when $V_{OF1}-V_r+V_{R11}+\epsilon=0$ is satisfied. In the first preferred embodiment, the variable current source controller 32 controls the variable current source 33 in response to the signal indicating the result of comparison from the comparator 31, whereby the voltage drop $V_{R11}$ is adjusted to allow the output offset voltage $\Delta V_O$ to be at a minimum. That is, adjustment of the voltage drop $V_{R11}$ serves to minimize the absolute value of $V_{OF1}-V_r+V_{R11}+\epsilon$.

Figure 2:
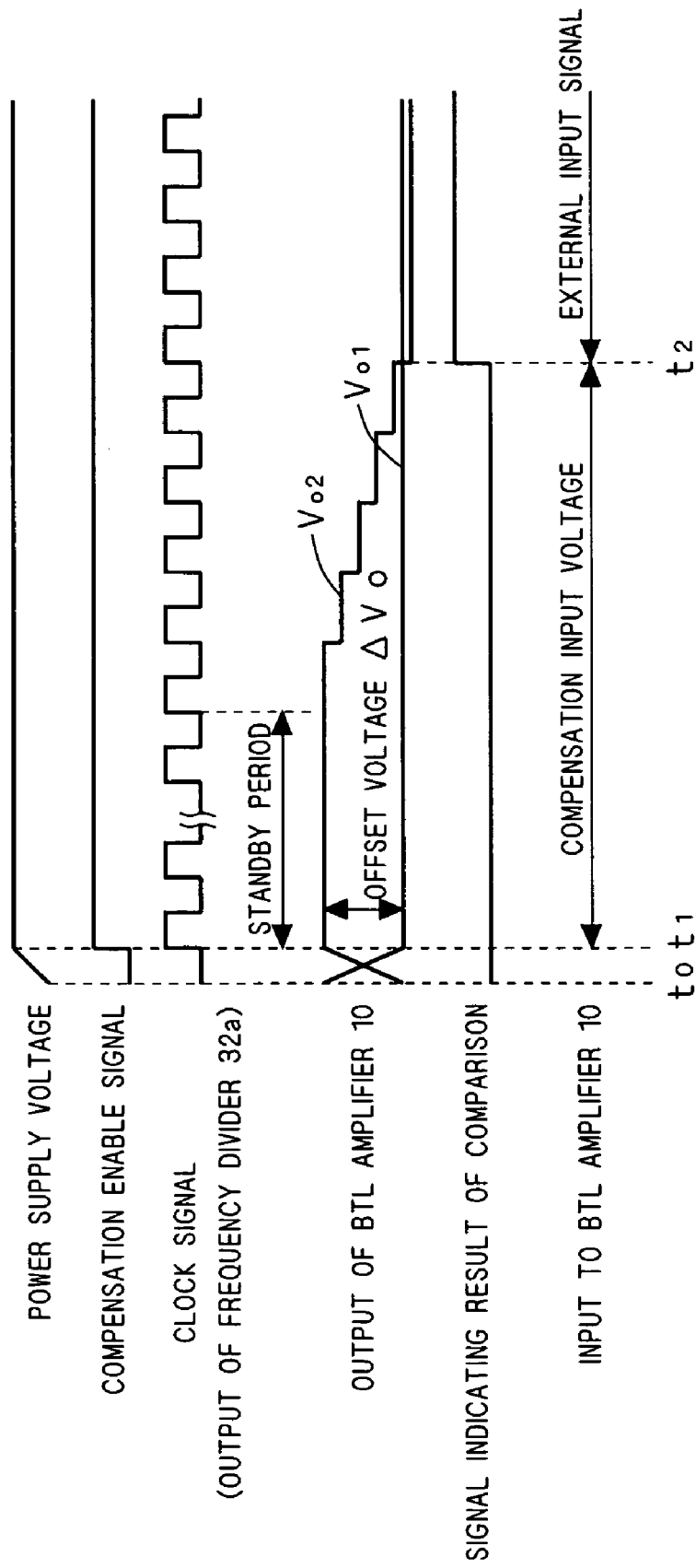
FIG. 2 is a timing chart for explaining offset compensation in the BTL amplifier system according to a first preferred embodiment of the present invention.

Next, the offset compensation in the BTL amplifier system according to the first preferred embodiment will be discussed with reference to the timing chart of FIG. 2. First, the BTL amplifier system is turned on at time $t_0$. When the power supply voltage reaches a predetermined level at subsequent time $t_1$, the startup control circuit 34 detects this turn-on, allows offset compensation, and sends the compensation enable signal to the variable current source controller 32.

On receipt of the compensation enable signal, the variable current source controller 32 controls the input switching circuit 20 to turn the switching circuits 21 and 22 off and turn the switching circuits 23 and 24 on, to thereby cause the internal reference voltage source 30 to apply the compensation input voltages to the first and second input terminals T1 and T2. As a result, the first and second external input voltages $V_{I1}$ and $V_{I2}$ of the BTL amplifier 10 are controlled to be at the same level. At this time, in the ideal BTL amplifier 10 producing no output offset voltage, the first and second output voltages $V_{O1}$ and $V_{O2}$ (first and second compensation output voltages) are the same. With reference to FIG. 2, however, the offset compensation will be discussed on the assumption that the second compensation output voltage is higher than the first compensation output voltage and thus the BTL amplifier 10 and thus the BTL amplifier 10 gives the nonzero output offset voltage $\Delta V_O$.

The comparator 31 compares the first and second compensation output voltages in level, and outputs the signal indicating the result of comparison. The variable current source controller 32 is placed in standby for a certain period of time to provide stability of the first and second compensation output voltages, and thereafter, makes reference to the signal indicating the result of comparison from the comparator 31. At this stage, the second compensation output voltage is higher than the first compensation output voltage and the output offset voltage is generated, thus placing the signal indicating the result of comparison at L level as shown in FIG. 2.

The variable current source controller 32 takes count of the number of pulses of the clock signal divided in frequency by the frequency divider 32a to convert the counted value to the N-bit digital control signal, whereby the variable current source 33 is controlled to cause current change through the resistance element R11. That is, each time the number of pulses of the clock signal is counted, the current flowing through the resistance element R11 supplied from the variable current source 33 is gradually changed. When the signal indicating the result of comparison is at L level, the voltage at the output reference voltage input terminal T6 is gradually lowered to cause gradual reduction of the second compensation output voltage. Conversely, when the signal indicating the result of comparison is at H level, the voltage at the output reference voltage input terminal T6 is gradually raised to cause gradual rise of the second compensation output voltage.

The signal indicating the result of comparison is at L level in this example and hence, the variable current source controller 32 gradually lowers the second compensation output voltage. The variable current source controller 32 continues to lower the second compensation output voltage making reference to the signal indicating the result of comparison until the signal indicating the result changes in level. When the signal indicating the result of comparison makes transition from L level to H level at time $t_2$ as indicated in FIG. 2, the variable current source controller 32 holds the digital control signal obtained at the time t2, thereby keeping the second compensation output voltage at the same instant. That is, as indicated in FIG. 2, the difference between the first and second compensation output voltages is kept at a minimum from the time $t_2$ onward, whereby the offset compensation is completed. The variable current source controller 32 also controls the input switching circuit 20 to turn the switching circuits 21 and 22 on and turn the switching circuits 23 and 24 off, thereby connecting the first and second external input terminals T7 and T8 to the first and second input terminals T1 and T2, respectively. The BTL amplifier 10 is thus brought into a condition allowing application of the first and second external input voltages $V_{I1}$ and $V_{I2}$.

Although not shown, the subsequent operation includes application of the first and second external input voltages $V_{f1}$ and $V_{f2}$ to the BTL amplifier 10 through the first and second external input terminals T7 and T8, respectively, whereby the BTL amplifier 10 serves for the usual signal amplification. When the BTL amplifier 10 performs amplification of the external input voltage (difference between the first and second external input voltages $V_{f1}$ and $V_{f2}$), the variable current source controller 32 continues to hold the digital control signal after offset compensation to keep the voltage at the output reference voltage input terminal T6 at the level after offset compensation. Hence, the output voltage between the first and second output terminals T3 and T4 includes no offset voltage. As a result, an offset voltage does not cause undesirables such as adverse effect on a post-stage circuit of the BTL amplifier 10, or generation of unintended current flow through a load in a no-signal stage.

In the first preferred embodiment, the output offset voltage of the BTL amplifier 10 after offset compensation is given by the following formula (3):

$$\Delta V_O = \sqrt{\left(\frac{V_{ran}}{2^N}\right)^2 + \Delta V_{com}^2} \quad (3)$$

where $V_{ran}$ is the adjustable range of the output voltage of the inverting amplifier 12 in the offset compensation, $\Delta V_{com}$ is the input offset voltage of the comparator 31, and N is the resolution (the number of bits) of the variable current source controller 32. In the conventional BTL amplifier, the output offset voltage increases in proportion to the gain of the BTL amplifier as seen from the foregoing formula (1), whereas in the first preferred embodiment, the output offset voltage has no dependence on the gain. That is, offset voltage reduction of the present invention is effective especially for a high gain BTL amplifier.

Second Preferred Embodiment

In the description of the first preferred embodiment, the offset compensation starts at turn-on of the BTL amplifier system. However, start of the offset compensation of the present invention is not necessarily required to coincide with turn-on of the BTL amplifier system. That is, the offset compensation may start at arbitrary time prior to amplification of the external input voltage by the BTL amplifier 10.

In a second preferred embodiment of the present invention, offset compensation is timed to start when the BTL amplifier system returns to an operating state from a standby state in which the BTL amplifier system does not perform signal amplification. As an example, the BTL amplifier system is placed in a standby state when a device into which the BTL amplifier system is incorporated is in a so-called "sleep mode" or in a so-called "low power consumption mode". In the second preferred embodiment, the "sleep mode" is used to cause standby state of the BTL amplifier system.

The BTL amplifier system of the second preferred embodiment has the configuration shown in FIG. 1. Besides, the startup control circuit 34 serves to monitor a sleep releasing signal indicating release of the device from the sleep mode into which the BTL amplifier system is incorporated, as well as to monitor a power supply voltage. When the device is turned on and released from the sleep mode, the startup control circuit 34 allows offset compensation and sends the compensation enable signal to the variable current source controller 32. In the second preferred embodiment, the sleep releasing signal at L level means the device is at the sleep mode, whereas the sleep releasing signal at H level means release of the device from the sleep mode.

Figure 3:
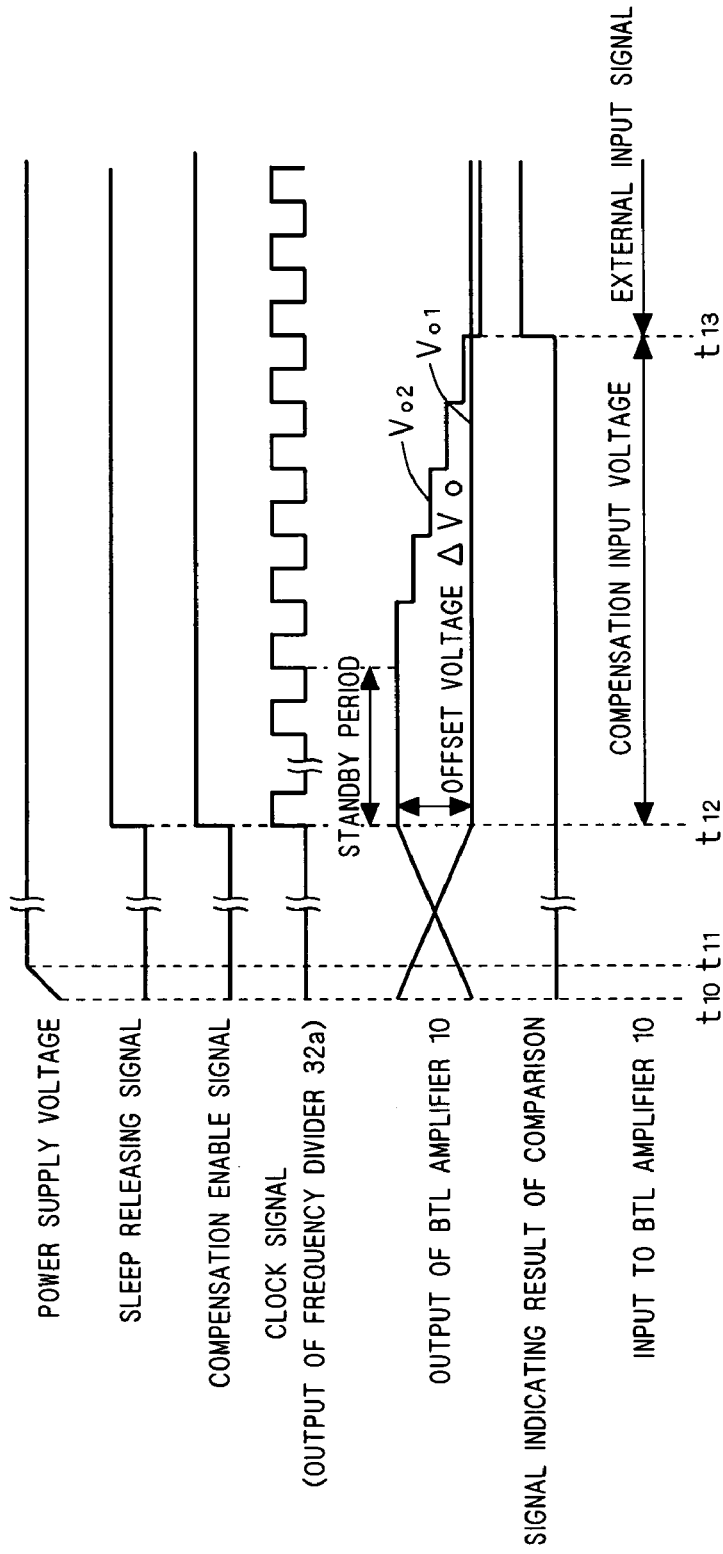
FIG. 3 is a timing chart for explaining offset compensation in the BTL amplifier system according to a second preferred embodiment of the present invention.

FIG. 3 is a timing chart for explaining offset compensation in the BTL amplifier system according to the second preferred embodiment. First, the device is turned on at time $t_{10}$. When the power supply voltage reaches a predetermined level at subsequent time $t_{11}$, the startup control circuit 34 detects this turn-on. For simplification of the description, the device into which the BTL amplifier system is incorporated is assumed to be brought into the sleep mode immediately after turn-on.

When the sleep releasing signal is switched to H level to release the device from the sleep mode at time $t_{12}$, the startup control circuit 34 allows offset compensation and sends the compensation enable signal to the variable current source controller 32. In other words, the compensation enable signal sent from the variable current source controller 32 in the second preferred embodiment is the logical product of the power supply voltage and the sleep releasing signal.

The subsequent offset compensation is the same as followed in the first preferred embodiment after the time $t_1$ in FIG. 1, and the description thereof is omitted.

When the offset compensation is completed at time $t_{13}$, the variable current source controller 32 controls the input switching circuit 20 to connect the first and second external input terminals T7 and T8 to the first and second input terminals T1 and T2, respectively. The BTL amplifier 10 is thus brought into a condition allowing application of the first and second external input voltages $V_{f1}$ and $V_{f2}$.

The subsequent operation includes application of the first and second external input voltages $V_{f1}$ and $V_{f2}$ to the BTL amplifier 10 through the first and second external input terminals T7 and T8, respectively, whereby the BTL amplifier 10 starts to amplify the external input voltage (difference between the first and second external input voltage $V_{f1}$ and $V_{f2}$). When the BTL amplifier 10 performs amplification of the external input voltage, the variable current source controller 32 continues to hold the digital control signal after offset compensation. Like the first preferred embodiment, the output voltage between the first and second output terminals T3 and T4 includes no offset voltage.

As discussed, the offset compensation timed to occur when the BTL amplifier system is released from the standby state (sleep mode) provides the same effect as obtained in the first preferred embodiment. Further, the second preferred embodiment characteristically uses an existing signal such as the sleep releasing signal as a trigger to start the offset compensation, thereby advantageously realizing cost reduction relative to the first preferred embodiment.

In the second preferred embodiment, the offset compensation is triggered by the sleep releasing signal outputted after turn-on, which trigger signal is not limited to this. As long as release of the BTL amplifier system from the standby state is shown, an alternative signal such as a signal indicating release of the BTL amplifier system from the low power consumption mode is applicable as a trigger signal.

While the invention has been shown and described in detail, the foregoing description is in all aspects illustrative and not restrictive. It is therefore understood that numerous modifications and variations can be devised without departing from the scope of the invention.

What is claimed is:

1. A BTL (balanced transformer-less) amplifier system, comprising:

a BTL amplifier including a differential amplifier for amplifying a voltage difference between first and second input terminals to output a first output voltage, and an inverting amplifier for inverting said first output voltage to output a second output voltage;

a compensation input voltage application circuit capable of applying compensation input voltages at the same level to said first and second input terminals;

a comparator for making comparison between first and second compensation output voltages which are respectively said first and second output voltages as a result of application of said compensation input voltages to said first and second input terminals; and a reference voltage control circuit for offset compensation, said offset compensation being realized by controlling a voltage at an output reference voltage input terminal of said inverting amplifier in response to an output signal from said comparator to minimize a difference between said first and second compensation output voltages.

2. The BTL amplifier system according to claim 1, wherein said reference voltage control circuit comprises:

a resistance element connected to said reference voltage input terminal;

a variable current source for changing a current flowing through said resistance element to vary a voltage at said reference voltage input terminal; and a variable current source controller for controlling said variable current source.

3. The BTL amplifier according to claim 2, wherein said offset compensation includes control of said variable current source by said variable current source controller to cause gradual change of a current flowing through said resistance element and to hold a current value at the time when said output signal from said comparator makes transition.

4. The BTL amplifier system according to claim 1, wherein application of said compensation input voltages by said compensation input voltage application circuit to said first and second input terminals and said offset compensation by said reference voltage control circuit are carried out in response to turn-on of said BTL amplifier system.

5. The BTL amplifier system according to claim 1, wherein application of said compensation input voltages by said compensation input voltage application circuit to said first and second input terminals and said offset compensation by said reference voltage control circuit are carried out in response to transition of said BTL amplifier system from a standby state to an operating state.

* * * * *